United States Patent
Matsuo

(10) Patent No.: US 7,413,463 B2
(45) Date of Patent: Aug. 19, 2008

(54) CONTAINING STRUCTURE FOR CIRCUIT BOARD

(75) Inventor: Tomoki Matsuo, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 11/492,179

(22) Filed: Jul. 25, 2006

(65) Prior Publication Data

US 2007/0020981 A1    Jan. 25, 2007

(30) Foreign Application Priority Data

Jul. 25, 2005    (JP) .............................. 2005-213774

(51) Int. Cl.
*H01R 13/64* (2006.01)
(52) U.S. Cl. ...................................... 439/377
(58) Field of Classification Search ................. 439/377, 439/374
See application file for complete search history.

(56) References Cited

U.S. PATENT DOCUMENTS

| | | | | |
|---|---|---|---|---|
| 4,204,737 | A * | 5/1980 | Faber et al. | 439/377 |
| 6,178,094 | B1 | 1/2001 | Hakozaki | |
| 6,361,350 | B2 * | 3/2002 | Johnson et al. | 439/374 |
| 6,661,673 | B2 | 12/2003 | Brooks et al. | |
| 6,783,384 | B2 * | 8/2004 | Wu | 439/377 |
| 2001/0003074 | A1 * | 6/2001 | Johnson et al. | 439/377 |

FOREIGN PATENT DOCUMENTS

| | | |
|---|---|---|
| FR | 2.231.180 | 12/1974 |
| JP | A 1-194397 | 8/1989 |
| JP | A-2000-049475 | 2/2000 |
| JP | A 2000-49475 | 2/2000 |
| JP | A-2001-068874 | 3/2001 |
| JP | A-2002-134963 | 5/2002 |
| JP | A-2005-136153 | 5/2005 |
| JP | A-2005-136154 | 5/2005 |

* cited by examiner

*Primary Examiner*—Gary F. Paumen
(74) *Attorney, Agent, or Firm*—Oliff & Berridge, PLC

(57) ABSTRACT

To prevent interference between an electronic element mounted on a circuit board and a casing upon inserting the circuit board into the casing and to facilitate insertion of the circuit board into the casing. A casing adapted to contain a circuit board may have opposed side walls each having a guide groove. Each guide groove has a narrow width portion with an even width in an inner part of the casing and a wide mouthed portion at an inlet port of the casing. The wide mouthed portion has first and second opposed slant surfaces that are gradually spaced away from each other toward the inlet port. The slant starting point of the first slant surface is nearer the inlet port than the slant starting point of the second slant surface. When the circuit board is inclined and inserted through the inlet port into the casing, the leading end of the circuit board initially contacts the first slant surface to restrain the inserting angle of the circuit board, thereby preventing an electronic element mounted on the circuit board from interfering with the peripheral edge of the casing around the inlet port.

10 Claims, 8 Drawing Sheets

CONTAINING STRUCTURE FOR CIRCUIT BOARD

BACKGROUND

This invention relates to a containing structure for a circuit board and more particularly to a containing structure for a circuit board in which the circuit board can be readily inserted into a casing in an electronic control apparatus. This application claims priority from Japanese Patent Public Disclosure JP-A-2005-213774, filed Jul. 25, 2005, the entire contents of which are incorporated herein by reference.

Conventionally, an electronic control apparatus to be mounted on a motor vehicle contains in a casing a circuit board on which electronic elements are mounted. Some casings are provided in the interior with guide grooves that serve to guide the circuit board into the casing and hold it at a predetermined position in the casing.

For example, in Japanese Patent Public Disclosure 2000-49475 JP-A-2000-49475), the width of each guide groove at an inlet side for a circuit board is set to be great enough to enable the circuit board to be inserted into the casing.

The width of the guide groove may be enlarged at the inlet side of the casing to form a wide mouthed portion as disclosed in JP-A-2000-49475. In that case, when a circuit board 2 is inserted into the casing 1 slantwise, as shown in FIG. 8, a leading end 2a of the circuit board 2 contacts a slant surface 4 on the wide mouthed portion 3a, which is formed by widening a width of the guide groove 3, and the guide groove 3 restrains an inserting direction of the circuit board 2.

Thus, in the case where the guide groove 3 is provided with the wide mouthed portion 3a, an inlet port for the circuit board 2 becomes larger, thereby facilitating insertion of the circuit board 2 into the casing 1.

SUMMARY

However, as shown in FIG. 9, if a vertical width Y and a horizontal depth X of the wide mouthed portion 3a in the guide groove are relatively large with respect to the circuit board, the leading end 2a of the circuit board 2 cannot contact the slant surface 4, unless a main part of the circuit board 2 is inserted into the casing 1. If the casing 1 is formed into a thin configuration, there is insufficient space to contain the circuit board 2 in the casing 1. As shown in FIG. 9, a peripheral edge 1a around the inlet port in the casing 1 will interfere with electronic elements mounted on the circuit board 2, before the leading end 2a of the circuit board 2 contacts with the slope surface 4. Consequently, the electronic element may be broken or sheared from the circuit board 2.

In view of the above problems, it is an object of exemplary embodiments of the present invention to prevent interference between an electronic element mounted on a circuit board and a casing while inserting the circuit board into the casing, and to facilitate insertion of the circuit board into the casing.

In order to address the above problems, exemplary embodiments of the present invention provide a containing structure for a circuit board wherein a circuit board with an electronic element mounted thereon is inserted into and contained in a casing through an inlet port provided in an end of the casing. The casing may have a box-like configuration and have opposed side walls each having a guide groove that extends from the inlet port to an inner part at the other end of the casing opposite from the inlet port. The guide grooves are adapted to slidably receive opposite side edges of the circuit board. Each of the guide grooves includes a straight narrow width portion with an even width in the inner part in the casing and a wide mouthed portion at the inlet port. The wide mouthed portion is defined by first and second slant surfaces that are gradually spaced away from each other toward the inlet port. A slant starting point of the first slant surface is disposed nearer the inlet port than that of the second slant surface. The first slant surface is disposed at a side where a leading end of the circuit board can contact the first slant surface when the circuit board is inclined and inserted into the inlet port. An inserting angle of the circuit board can be restrained so that the leading end approaches the centerline of the narrow width portion, thereby preventing interference between the electronic element mounted on the circuit board and the peripheral edge of the casing around the inlet port.

In more detail, the inlet port is provided in the front end of the casing. The guide grooves may be provided in each opposed side walls of the casing. Each groove is formed by upper and lower groove surfaces. The first slant surface is arranged at the lower groove surface while the second slant surface is arranged at the upper groove surface. The leading end of the circuit board is inclined down and inserted into the inlet port.

According to the above structure, since the wide mouthed portion of the guide groove is provided at the casing open side and the slant starting point of the first slant surface in the wide mouthed portion is nearer the inlet port than the slant starting point of the second slant surface, the circuit board is inserted slantwise into the casing and initially brought into contact with the first slant surface. The circuit board that contacts with the first slant surface is further pushed into the casing and the inserting angle of the circuit board is restrained at the initial stage by the guide groove. Then, the circuit board can be fully inserted into the casing. Since the inserting angle of the circuit board that is being inserted into the casing is restrained at the initial insertion stage by the first slant surface of the guide groove, it is possible to prevent the electronic element mounted on the circuit board from interfering with the peripheral edge of the casing around the inlet port, thereby preventing the electronic element from being broken or sheared from the circuit board. Thus, it is possible to facilitate the work of inserting the circuit board into the casing. It is also possible to reduce assembly costs, since no jig is needed to prevent interference between the electronic element and the casing.

Preferably, the slant angle of the first slant surface is set to be greater than the slant angle of the second slant surface.

According to the above structure, although the slant starting point is disposed near the inlet port, it is possible to form the groove to have a sufficiently large width at the open end of the wide mouthed portion and to facilitate the work of inserting the circuit board into the casing, because the slant angle of the first slant surface is relatively large.

During insertion, the circuit board contacts with the first slant surface and is restrained by the slant angle of the first slant surface. Accordingly, it is possible to reliably prevent interference between the electronic element and the casing while restraining the inserting angle of the circuit board.

Preferably, the guide groove extends from an open end of the casing to an inner end of the casing and the first slant surface is formed on an area of one fourth or smaller than one fourth of the whole length of the guide groove.

According to the above structure, it is possible to reliably prevent interference between the electronic element mounted on the circuit board and the casing, since the inserting direction of the circuit board is restrained so that the circuit board moves straight into the guide groove when the circuit board is inserted into the casing by a distance of about one fourth of the guide groove.

In some embodiments of the invention, an intermediate slant surface is provided on the inner part from the slant surface. This intermediate slant surface connects the first and second slant surfaces, respectively, with the interior of the guide groove. The slant angle of the intermediate slant surface is smaller than that of the slant surface.

According to the above structure, it is possible to smoothly insert the circuit board into the casing, since the inserting angle of the circuit board is limited to an angle by which the electronic element mounted on the circuit board does not interfere with the casing by the slant surface of the wide mouthed portion provided at the open end side and further limited to a gentle angle gradually by the intermediate gentle slope surface. Also, it is possible to prevent or restrict the circuit board from rattling in the casing after the circuit board has been inserted into the casing, since the narrow width portion is provided in the inner part of the intermediate gentle slope surface in the casing and the narrow width portion positions and holds the circuit board in the casing.

A plurality of circuit boards may be contained in the casing, and a plurality of guide grooves may be juxtaposed in the interiors of the side walls of the casing. Opposite side guide grooves out of the juxtaposed guide grooves are provided with wide mouthed portions.

In such embodiments, the electronic element mounted on the circuit board inserted into the guide grooves are disposed near the peripheral walls of the casing may be more likely to interfere with the casing upon inserting the circuit board into the casing. However, according to the above structure, it is possible to prevent interference between the electronic element and the casing by employing the wide mouthed portion at least in the guide grooves closest to the peripheral walls of the casing. The wide mouthed portion may be provided for any guide grooves among a plurality of guide grooves.

As described above, according to the exemplary embodiments of the present invention, since the wide mouthed portion is provided at the casing open side of the guide groove in the interior of the casing, and the slant starting point of the first slant surface on the wide mouthed portion is disposed nearer the inlet port than the slant starting point of the second slant surface, the circuit board is inserted slantwise into the casing and initially brought into contact with the first slant surface. The inserting angle of the circuit board is initially restrained by the guide groove, preventing interference between the electronic element mounted on the circuit board and the casing. Therefore, it is possible to prevent the electronic element mounted on the circuit board from interfering with the peripheral edge of the casing around the inlet port during insertion of the circuit board into the casing, thereby preventing the electronic element from being broken or sheared from the circuit board.

Those and other objects, advantages and features are described in or apparent from the following detailed description.

BRIEF DESCRIPTION OF THE DRAWINGS

Exemplary embodiments will be described in connection with the attached drawings, in which like numerals represent like parts, and in which.

DETAILED DESCRIPTION OF EMBODIMENTS

Figure 1:
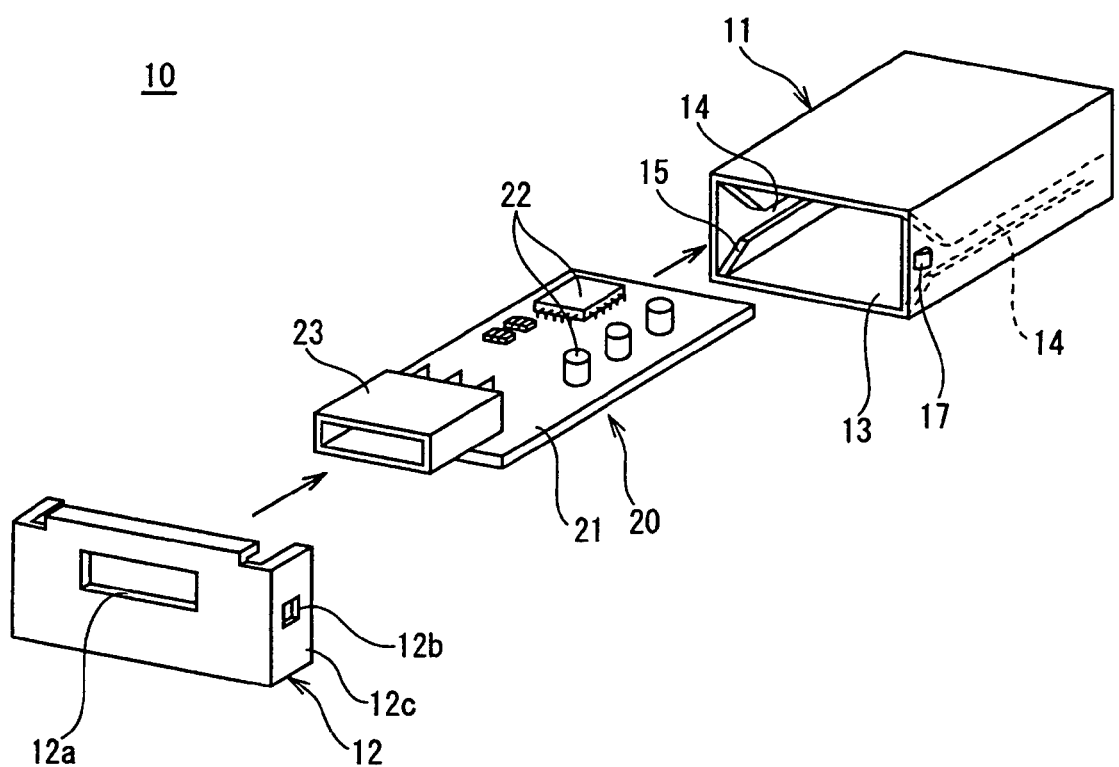
FIG. 1 is an exploded perspective view of an electronic control apparatus of a first embodiment in accordance with the present invention.

Referring now to the drawings, embodiments of a containing structure for a circuit board (printed board) in accordance with the present invention will be described below.

FIGS. 1 through 5 show a first embodiment of a containing structure for a circuit board (printed board) in accordance with the present invention. An electronic control apparatus 10 includes a box-like casing 11 having an open end, a printed board (circuit board) 20 to be contained in the casing 11, and a lid 12 for covering the open end of the casing 11.

Figure 2A:
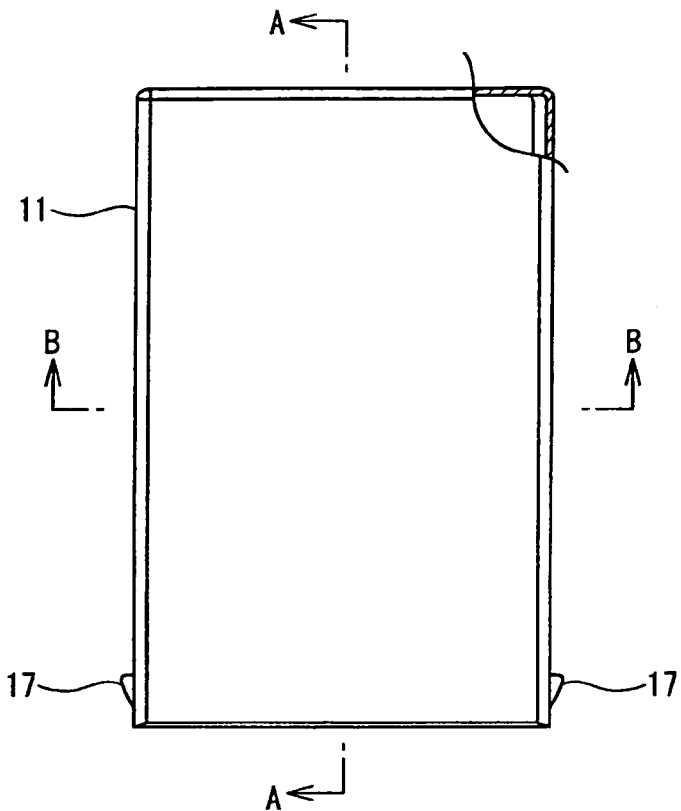
FIG. 2A is a plan view of a casing in the first embodiment.
Figure 2B:
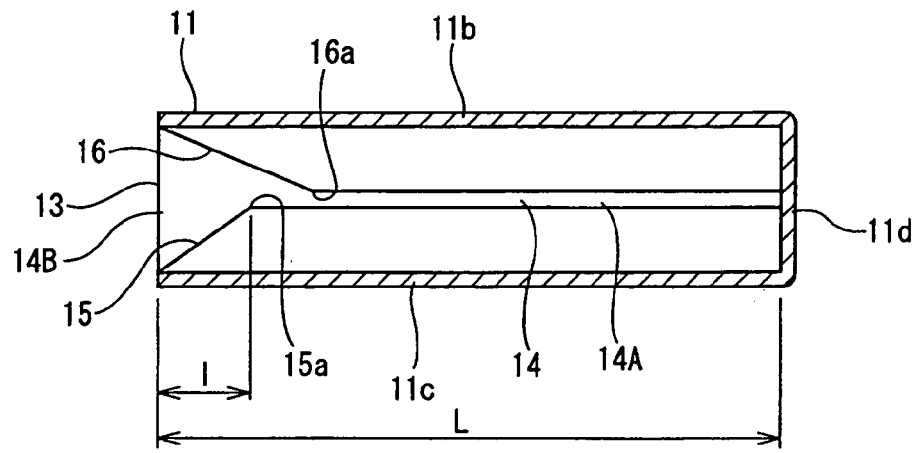
FIG. 2B is a longitudinal section view of the casing taken along line A-A in FIG. 2A.
Figure 2C:
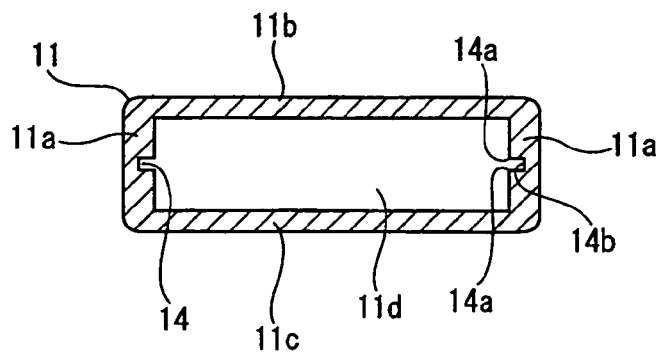
FIG. 2C is a cross section view of the casing taken along line B-B in FIG. 2A.

The casing 11 has a box-like configuration molded by a resin material. The casing 11 is provided in a front end with an inlet port 13 for receiving the printed board 20. As shown in FIGS. 2B and 2C, the casing 11 is provided in the interiors of opposed right and left side walls 11a with a pair of guide grooves 14 and on the exteriors of the opposed side walls 11a at the side of the inlet port 13 with lock pawls 17 (FIG. 2A).

The pair of guide grooves 14 serve to guide the printed board 20 into the casing 11 and receive slidably the opposite side edges of the printed board 20 to hold the printed board 20 in place in the casing 11. Each guide groove 14 includes upper and lower surfaces 14a opposed to each other in a width direction of the guide groove 14 and a bottom surface 14b. A straight, narrow width portion 14A with even width is defined between the upper and lower side surfaces 14a in an inner part of the casing 11 while a wide mouthed portion 14B is defined between a first slant surface 15 and a second slant surface 16 at the inlet port side. The first and second slant surfaces are gradually spaced away from each other toward the inlet port 13.

The narrow width portion 14A in the guide groove 14 is arranged in parallel with and spaced in about equidistance away from a top wall 11b and a bottom wall 11c of the casing 11. The inlet port 13 is communicated with the wide mouthed portion 14B. The narrow width portion 14A extends to an inner wall 11d. A width of the narrow width portion 14A is set to be slightly greater than a thickness of the printed board 20. The opposite side walls 14a clamp the opposite side edges of the upper and lower surfaces of the printed board 20.

It should be noted that the narrow width portion 14A might be arranged not on a central position in a vertical direction of the casing 11 but near the top wall 11b or the bottom wall 11c.

In the wide mouthed portion 14B in the guide groove 14, the first slant surface 15 at a lower side is different from the second slant surface 16 at an upper side with respect to slant starting points 15a and 16a. The slant starting point 15a of the first slant surface 15 is disposed further near the inlet port 13 than the slant starting point 16a of the second slant surface 16. A slant angle of the first slant surface 15 is greater than that of the second slant surface 16 (measured with respect to upper and lower side surfaces 14a). It is preferable that the distance 1 from the inlet port 13 in the casing 11 to the slant starting point 15a of the first slant surface 15 is equal to or lower than one fourth of the whole length L of the guide groove 14. In the first embodiment, the distance 1 is set to be one fifth of the whole length L of the guide groove 14. It is also preferable that the slant angle of the first slant surface 15 is set to be in a range of 30 to 60 degrees. In the first embodiment, the slant angle is set to be 45 degrees. It is preferable that the slant angle of the second slant surface 16 is set to be in a range of 20 to 40 degrees. In the first embodiment, the slant angle is set to be 30 degrees. Furthermore, a width of the guide groove 14 at the open end side accords with a distance between the interiors of the top wall 11b of the casing 11 and the bottom wall 11c of the casing 11.

The printed board 20 to be contained in the casing 11 has a base plate 21 on upper and lower sides of which conductors (not shown) are printed and predetermined electronic elements are mounted. In the first embodiment, large-size electronic elements 22 are mounted on the upper side of the base plate 21. The base plate 21 is provided at a rear end opposite from the inlet port side with a connector 23 (FIG. 1) projecting partially from the rear end.

Figure 3A:
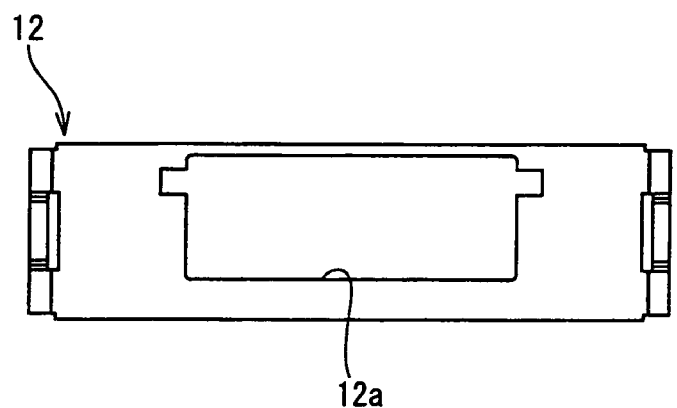
FIG. 3A is a front elevation view of a lid in the first embodiment.
Figure 3B:
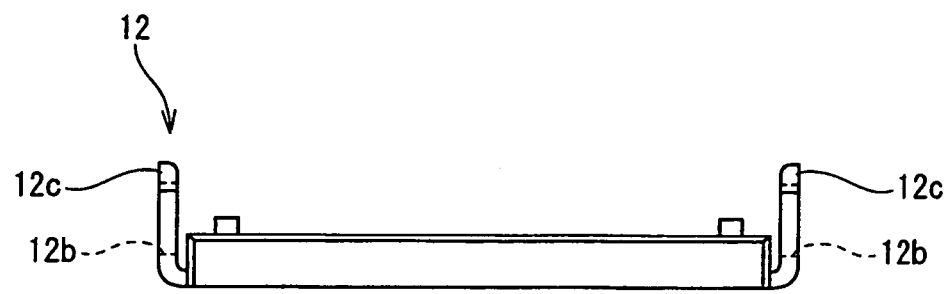
FIG. 3B is a plan view of the lid.

The lid 12 adapted to cover the inlet port 13 of the casing 11 is provided with a connector receiving hole 12a for exposing the connector 23 of the printed board 20 outward from the casing 11. An engaging frame 12c extends toward the inlet port 13 in the casing 11 from each of the opposite side ends of the lid 12. The engaging frame 12c is provided with an engaging hole 12b (FIGS. 1, 3A and 3B).

Figure 4A:
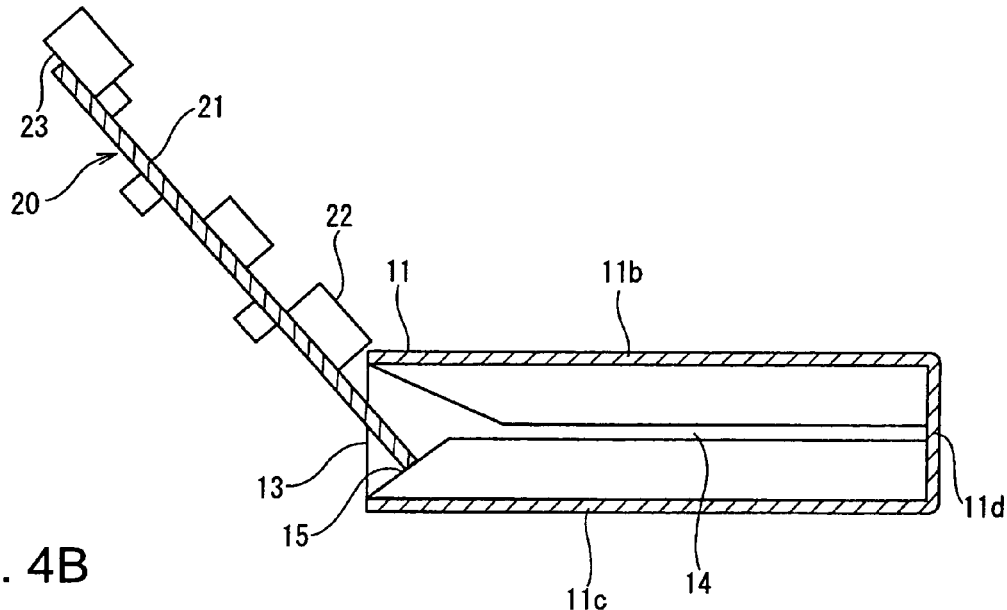
FIGS. 4A through 4C are explanatory views illustrating a method for inserting a printed board into the casing.
Figure 4B:
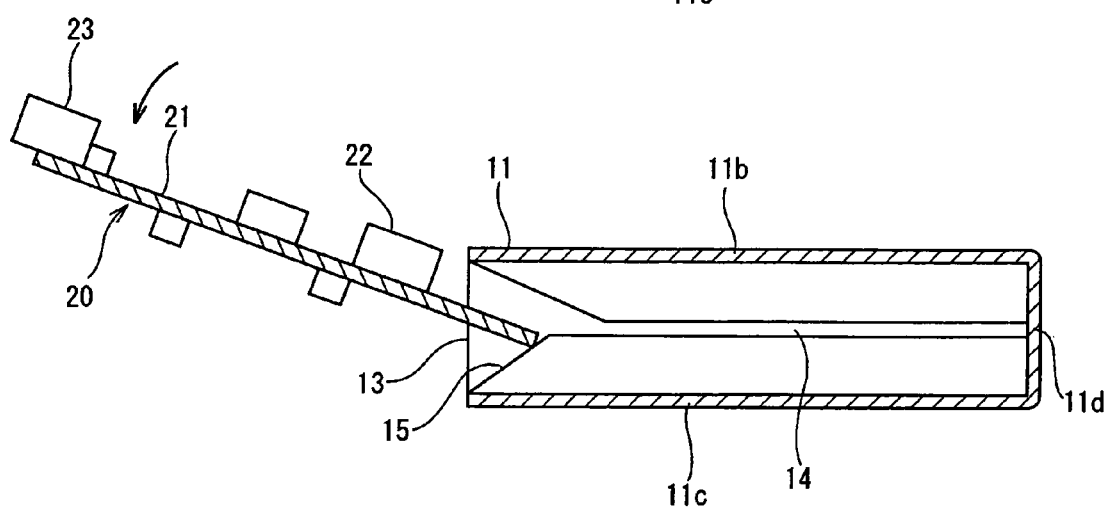
Figure 4C:
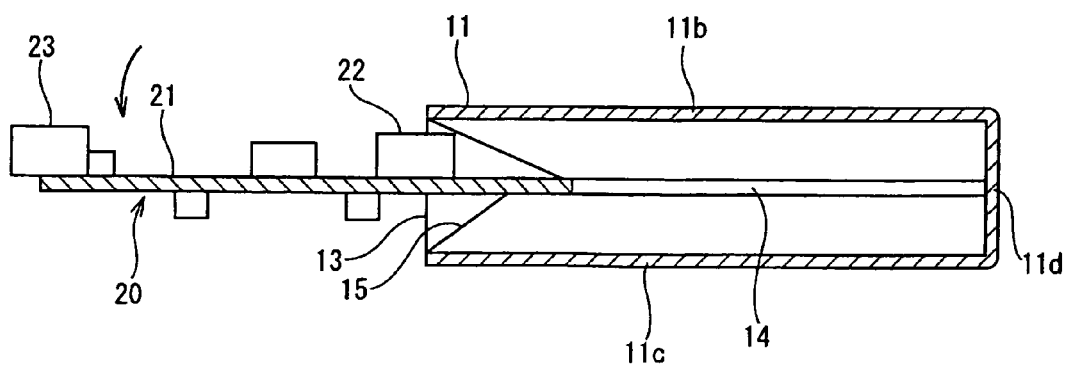

When the printed board 20 is inserted in the casing 11, as shown in FIG. 4A, the printed board 20 is inclined down toward the casing 11 and the printed board 20 is inserted into the inlet port 13 in the casing 11. Then, the opposite side edges of the leading end of the printed board 20 are brought into contact with the first slant surface 15 of the guide groove 14 in the casing 11. Since the slant starting point 15a of the first slant surface 15 is disposed near the inlet port 13, the leading end of the printed board 20 contacts the first slant surface 15 at an initial stage of the inserting work. Consequently, it is possible to permit the leading end of the printed board 20 to contact the first slant surface 15 before an electronic element 22 mounted on the printed board 20 interferes with the peripheral edge around the inlet port 13. As shown in FIGS. 4B and 4C, the guide groove 14 restrains an inserting angle of the printed board 20 so that the printed board moves toward a central axial direction of the narrow width portion 14A.

Figure 5:
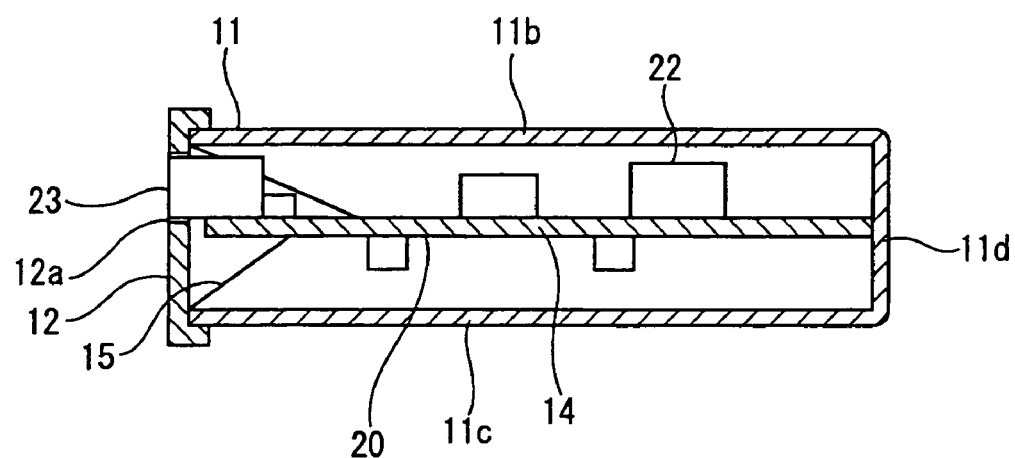
FIG. 5 is a longitudinal section view of the casing and printed board contained in the casing.

As shown in FIG. 5, the printed board 20 is pushed into the casing 11 until the leading end of the printed board 20 contacts the inner wall 11d of the casing 11. Under this condition, the lid 12 is put on the inlet port 13 and the lock pawls 17 on the casing 11 engage with engaging holes 12b in the lid 12 so that the lid 12 is locked on the casing 11. The connector 23 attached to the printed board 20 is exposed outward through the connector receiving hole 12a in the lid 12 so that a mating connector (not shown) can be fitted to the connector 23.

According to the above structure, since the slant starting point 15a is provided on the first slant surface 15 of the guide groove 14 in the casing 11 of the electronic control apparatus 10 so that the slant starting point 15a is disposed further near the inlet port 13 than the slant starting point 16a of the second slant surface 16 and the slant angle of the first slant surface 15 is greater than that of the second slant surface 16, the printed board 20 is inclined down toward the casing 11 and inserted into the inlet port 13 in the casing 11. The printed board 20 is brought into contact with the first slant surface 15 at the initial stage. Thus, since the inserting angle of the printed board 20 is restrained at the initial stage by the first slant surface 15 of the guide groove 14, it is possible to prevent the electronic element 22 mounted on the printed board 20 from interfering with the peripheral edge around the inlet port 13 in the casing 11, thereby preventing the electronic element from being broken.

Figure 6A:
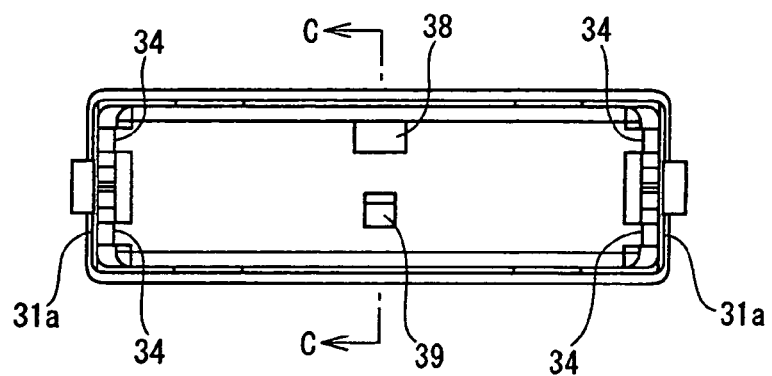
FIG. 6A is a front elevation view of a casing in a second embodiment.
Figure 6B:
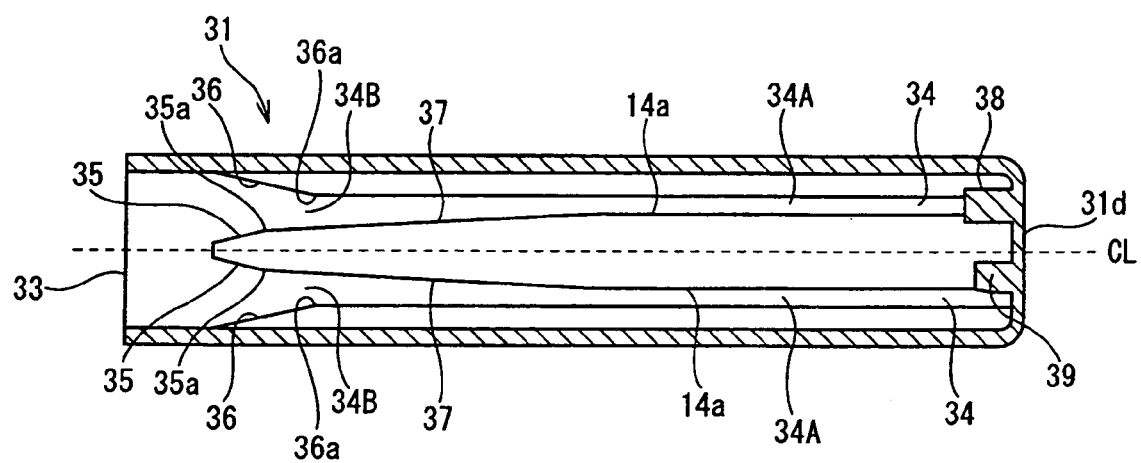
FIG. 6B is a cross section view of the casing taken along line C-C in FIG. 6A.

FIG. 6 shows a second embodiment of a containing structure for a circuit board (printed board) in accordance with the present invention.

In the second embodiment, the configuration of guide grooves provided in the opposite side walls of the casing is different from that in the first embodiment.

A casing 31 in the second embodiment is provided on opposite side walls 31a with two guide grooves 34. The two guide grooves 34 are substantially symmetrical with respect to a centerline CL extending on the center of the casing 31 in the vertical direction.

Each guide groove 34 includes a narrow width portion 34A in an inner part of the casing 31 and a wide mouthed portion 34B at the casing opening side. A slant starting point 35a of a first slant surface 35 adjacent to the centerline CL of the wide mouthed portion 34B is disposed nearer an inlet port 33 than a slant starting point 36a of a second slant surface 36, which is opposed to the first slant surface 35. An intermediate slant surface 37 is provided in an inner part of the first slant surface 35 so that a slant angle of the intermediate slant surface is smaller than that of the first slant surface 35. The first slant surface 35, intermediate slant surface 37, and the side surface 14a of the narrow width portion 34A are continuous to one another so that a slant angle of the side surface 14a adjacent to the centerline CL of the guide groove 34 changes through at least three steps. It is preferable that the slant angle of the first slant surface is in a range of 30 to 60 degrees. In the second embodiment, the slant angle is 45 degrees. It is preferable that the slant angle of the intermediate slant surface is in a range of 10 to 20 degrees. In the second embodiment, the slant angle is 15 degrees. Further, rather than being linear surfaces as depicted, the slant surfaces of this embodiment, or any other embodiment, could be curved.

An inner wall 31d of the casing 31 is provided with two protrusions 38 and 39. When a printed board (not shown) is inserted into one of the guide grooves 34 (an upper groove in FIG. 6) in the casing 31, a leading end of the printed board contacts the protrusion 38. When the printed board is inserted into the other guide groove 34 (a lower groove in FIG. 6) in the casing 31, an upper surface of the printed board contacts a lower surface of the protrusion 39. This holds the printed boards in place in the casing 31.

According to the above structure, it is possible to smoothly insert the printed board into the casing 31, since the inserting angle of the printed board is limited to an angle, by which the electronic element mounted on the printed board does not interfere with the casing 31, by the first slant surface 35 provided at the side of an inlet port 33, and is limited further to a gentle angle gradually by the intermediate slope surface 37.

Also, it is possible to prevent the printed board from rattling in the casing 31 after the printed board has been inserted into the casing 31, since the narrow width portion 34A is provided in the inner part of the intermediate gentle slope surface 37 and the narrow width portion 34A positions and holds the printed board in the casing 31.

It should be noted that the intermediate portion might be provided at a side opposite from the centerline CL out of the both side surfaces of the guide groove and the slant angles of both side surfaces might be changed at three steps.

Since the other structures and operation effects in the second embodiment are the same as those in the first embodiment, explanations of them are omitted here by giving the same labels to the same elements.

Figure 7:
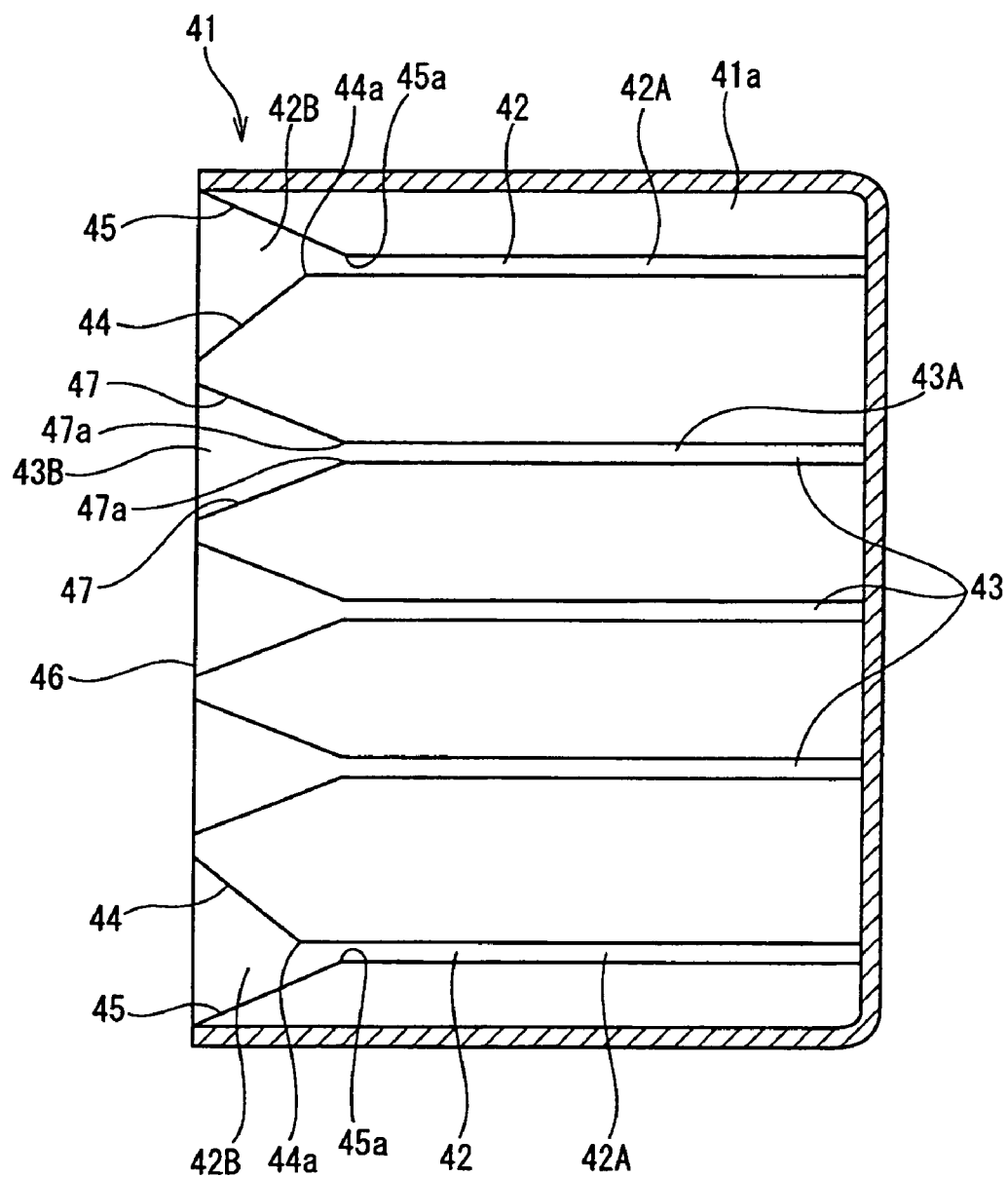
FIG. 7 is a sectional view of a casing in a third embodiment.
Figure 8:
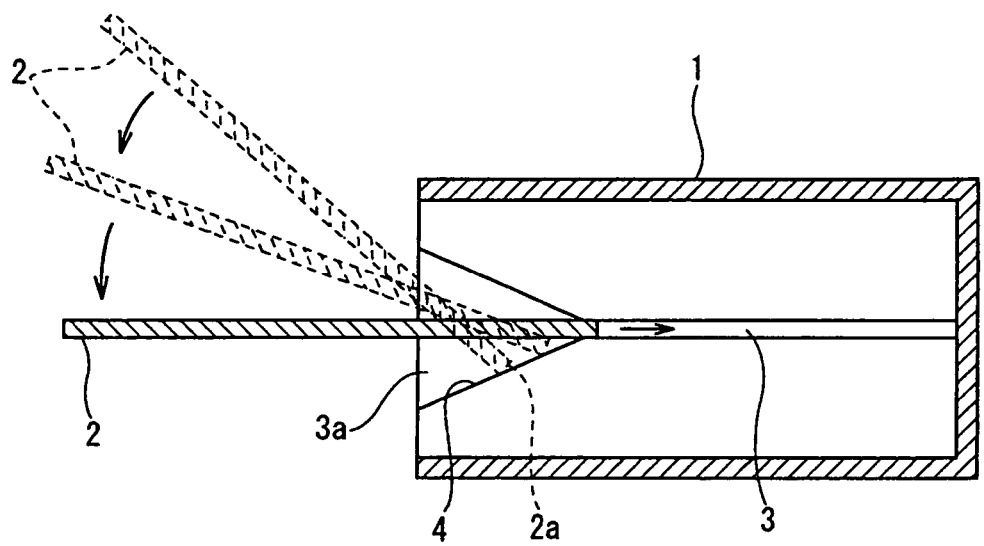
FIG. 8 is a sectional view of a conventional casing.
Figure 9:
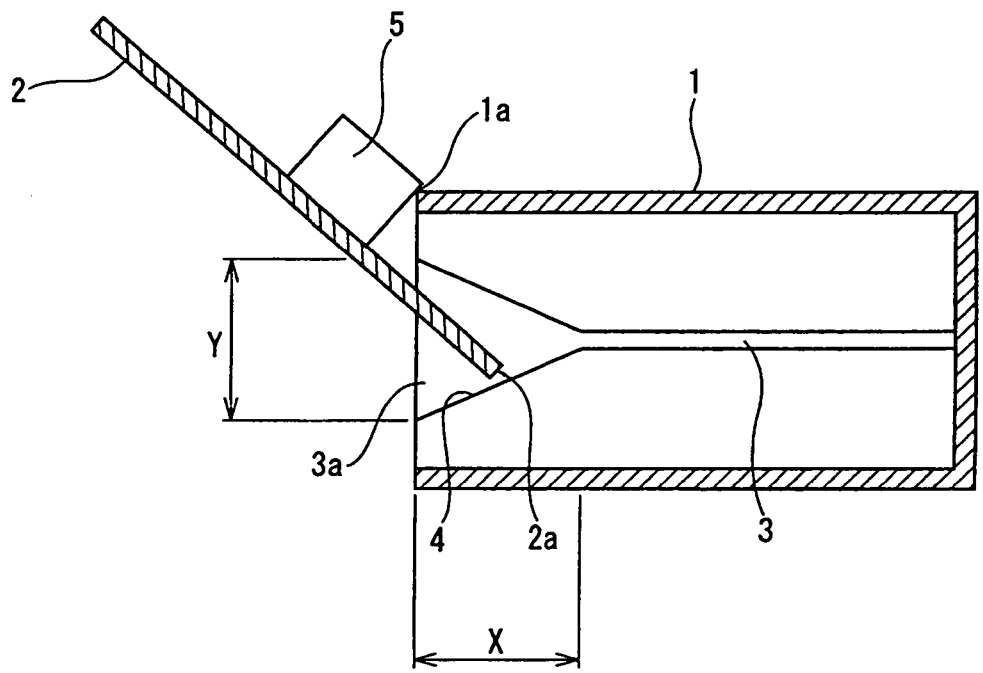
FIG. 9 is a sectional view of the conventional casing, illustrating problems in the conventional casing.

FIG. 7 shows a third embodiment of a containing structure for a circuit board (printed board) in accordance with the present invention.

In the third embodiment, a casing 41 is provided, in opposite side walls 41a, with five guide grooves 42. Two guide grooves 42 at the upper and lower sides have an asymmetrical configuration (as in the first embodiment of this invention) and three central guide grooves 43 have a symmetrical configuration.

The two upper and lower guide grooves 42 have narrow width portions 42A in inner parts and wide mouthed portions 42B at a casing opening side. A slant starting point 44a of a first slant surface 44 at a central side of the wide mouthed portion 42B is disposed further near an opening 46 than a slant starting point 45a of a second slant surface 45 at a side opposite from the first slant surface 44.

The three central guide grooves 43 have narrow width portions 43A in the inner parts and wide mouthed portions 43B at the side of the casing opening 43. Slant starting points 47a of both slant surfaces 47 of the wide mouthed portions 43B are disposed at an equal distance from an inlet port. A slant angle of each slant surface 47 is the same as that of the second slant surface 45 of the guide groove 42. Preferably, the slant angle is set to be in a range of 20 to 40 degrees. In the third embodiment, it is set at 30 degrees.

According to the above structure, it is possible to prevent interference between the electronic element mounted on the printed board and the casing, since the opposite side guide grooves 42 adjacent to the peripheral walls of the casing are provided with the first slant surfaces 44 in which the slant starting points are closer to the casing opening than the other slant surface.

It should be noted that the wide mouthed portion might be provided on the central guide grooves similar to the opposite side guide grooves. According to this structure, it is possible to prevent interference between the electronic element mounted on the printed board and the printed board contained in the casing.

Although one, two, or five sets of guide grooves are provided in a single casing in the first to third embodiments, three, four, or six or more sets of guide grooves may be provided in a single casing.

Although the invention has been described with reference to specific embodiments, those embodiments should be viewed as illustrations and not limiting. Various modifications, substitutions and improvements are possible within the spirit and scope of the invention.

What is claimed is:

1. A containing structure for a circuit board wherein a circuit board having an electronic element mounted thereon is inserted into a casing through an inlet port provided in an end of the casing and contained in the casing, the containing structure comprising:
   opposed side walls each having a guide groove that extends from the inlet port to an inner part of the casing and is adapted to slidably receive a side edge of the circuit board;
   each of the guide grooves including a narrow width portion with an even width in the inner part of the casing and a wide mouthed portion at the inlet port, the wide mouthed portion being defined by first and second slant surfaces that are gradually spaced away from each other toward the inlet port, a slant starting point of said first slant surface being disposed nearer the inlet port than that of the second slant surface.

2. A containing structure for a circuit board according to claim 1, wherein a slant angle of the first slant surface is greater than a slant angle of the second slant surface.

3. A containing structure for a circuit board according to claim 1, wherein each guide groove extends from an open end of the casing to an inner end of the casing, and the first slant surface is formed on an area of one fourth or smaller than one fourth of a whole length of the guide groove.

4. A containing structure for a circuit board according to claim 1, wherein an intermediate slant surface is provided continuously connecting the first and second slant surfaces to the narrow width portion of the guide groove, a slant angle of said intermediate slant surface is smaller than that of the first and second slant surfaces.

5. A containing structure for a circuit board according to claim 2, wherein each guide groove extends from an open end of the casing to an inner end of the casing, and the first slant surface is formed on an area of one fourth or smaller than one fourth of a whole length of the guide groove.

6. A containing structure for a circuit board according to claim 2, wherein an intermediate slant surface is provided continuously connecting the first and second slant surfaces to the narrow width portion of the guide groove, a slant angle of said intermediate slant surface is smaller than that of the first and second slant surfaces.

7. A combination, comprising:
   a casing including an inlet port and the containing structure of claim 1; and
   a circuit board having an electronic element mounted thereon, wherein
   the first slant surface is disposed at a side of the casing where a leading end of the circuit board contacts the first slant surface when the circuit board is inclined and inserted into the inlet port, an initial inserting angle of the circuit board being restrained by the first slant surface, thereby preventing interference between the electronic element and a peripheral edge of the casing around the inlet port.

8. A combination according to claim 7, wherein the inlet port is provided in a front end of the casing, the opposed side walls are walls of the casing, the groove is defined between upper and lower groove surfaces, the first slant surface is arranged at the lower groove surface while the second slant surface is arranged at the upper groove surface.

9. A combination according to claim 7, wherein a plurality of circuit boards are contained in the casing, a plurality of guide grooves are juxtaposed in the interiors of the side walls of the casing, at least opposite side guide grooves out of the juxtaposed guide grooves are provided with wide mouthed portions.

10. A combination according to claim 8, wherein a plurality of circuit boards are contained in the casing, a plurality of guide grooves are juxtaposed in the interiors of the side walls of the casing, at least opposite side guide grooves out of the juxtaposed guide grooves are provided with wide mouthed portions.

* * * * *